United States Patent [19]
Masuda et al.

[11] Patent Number: 4,706,105
[45] Date of Patent: Nov. 10, 1987

[54] SEMICONDUCTOR DEVICE AND METHOD OF PRODUCING THE SAME

[75] Inventors: Masachika Masuda, Kodaira; Gen Murakami, Machida, both of Japan

[73] Assignee: Hitachi, Ltd., Tokyo, Japan

[21] Appl. No.: 874,121

[22] Filed: Jun. 13, 1986

Related U.S. Application Data

[63] Continuation of Ser. No. 463,246, Feb. 2, 1983, abandoned.

[51] Int. Cl.⁴ .................... H01L 23/02; H01L 23/04; H01L 23/10; H01L 23/48
[52] U.S. Cl. ........................................ 357/74; 357/70; 357/68
[58] Field of Search ............... 357/70, 68; 174/52 FP; 361/421

[56] References Cited

U.S. PATENT DOCUMENTS 4,289,922 9/1981 Devlin .................................. 357/70
4,301,464 11/1981 Otsuki et al. ......................... 357/70

FOREIGN PATENT DOCUMENTS 0091455 7/1981 Japan .................................. 357/70

Primary Examiner—Andrew J. James
Assistant Examiner—S. V. Clark
Attorney, Agent, or Firm—Antonelli, Terry & Wands

[57] ABSTRACT

A semiconductor device comprising a square package body, a plurality of leads which jut out from each of four sides of the package body, a beveled portion which is formed in at least one corner of the package body, and leads which jut out from the beveled portion.

12 Claims, 8 Drawing Figures

SEMICONDUCTOR DEVICE AND METHOD OF PRODUCING THE SAME

This is a continuing application of application Ser. No. 463,246, filed Feb. 2, 1983 now aband.

BACKGROUND OF THE INVENTION

The present invention relates to a semiconductor device of the flat package type. More particularly, it relates to a semiconductor device having an increased number of pins and also to a method of producing the same.

In general, a semiconductor device of the flat package type can be made thinner and with increased number of pins as compared with a semiconductor device of the dual in-line package type. Moreover, the installation of the former on a mounting circuit board (printed circuit board) requires only mounting operations to substantially the same extent as in case of a semiconductor device of the chip carrier package type. Owing to these advantages, its demand is increasing. The semiconductor device of the specified type is usually so constructed that a semiconductor element pellet is fastened on a lead frame obtained by punching and forming a metal sheet and is electrically connected with leads, whereupon the pellet and the connected parts of the leads are encapsulated with a resin (plastics) into the shape of a square (regular square or oblong) and thin-walled package. When the shape of the package in plan is square in this manner, one corner of a package body 1 is removed to form a chamfered portion 2, as illustrated in FIG. 1, and the chamfered portion 2 is utilized as an index for a plurality of pins (leads) 3.

Meanwhile, semiconductor devices in recent years have a tendency toward an increasingly high density of integration and large number of pins. On the other hand, it is sometimes requested to keep the geometry of a package body constant for the reason of design, fabrication or mounting. In such cases, accordingly, the larger number of pins are inevitably coped with by making the pitches of the leads as small as possible and disposing the pins 3 with the perimeter of the four sides of the package body 1 utilized to the utmost.

In the prior art semiconductor device, however, the chamfered portion 2 as the index is formed, and no pin 3 is disposed in this portion. This lowers the degree of utilization of the four perimetric sides of the package body, and forms an obstacle to the increase of the number of pins. Moreover, since no pin is disposed in the chamfered portion 2, it is impossible, particularly on side faces 1a and 1b adjoining the chamfered portion 2, to array the pins symmetrically with respect to the center 0 of the package body 1. This sometimes leads to a demerit in design, fabrication or mounting. Further, as will be described in detail later, since no pin is disposed in the chamfered portion 2, naturally the part of the lead frame corresponding thereto is provided with no lead. For this reason, plastics leak out in the operation of molding with the plastics, resulting in the problem that degradation in the external appearance or chipping of the package is incurred to spoil the marketability of the semiconductor device.

SUMMARY OF THE INVENTION

A first object of the present invention is to provide a semiconductor device which can realize increase in the number of pins.

A second object of the present invention is to provide a semiconductor device which does not cause any demerit in design, fabrication and mounting.

A third object of the present invention is to provide a semiconductor device which can prevent the leakage of a resin in a resin molding operation.

A fourth object of the present invention is to provide a method of producing the semiconductor device described above.

A fifth object of the present invention is to provide a lead frame for use in the semiconductor device described above.

DESCRIPTION OF THE PREFERRED EMBODIMENTS

The present invention will be described in connection with illustrated embodiments.

Figure 1:
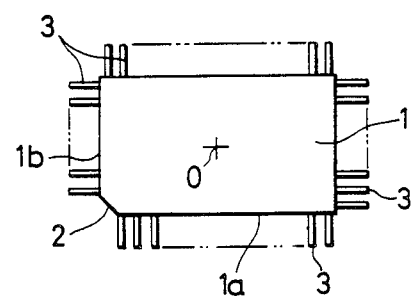
FIG. 1 is a plan view of a prior art semiconductor device.
Figure 2:
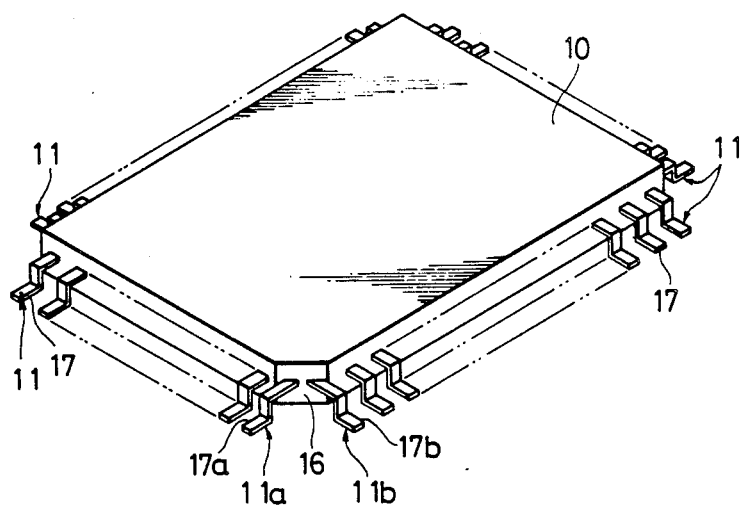
FIG. 2 is a perspective view of a semiconductor device according to an embodiment of the present invention.
Figure 3:
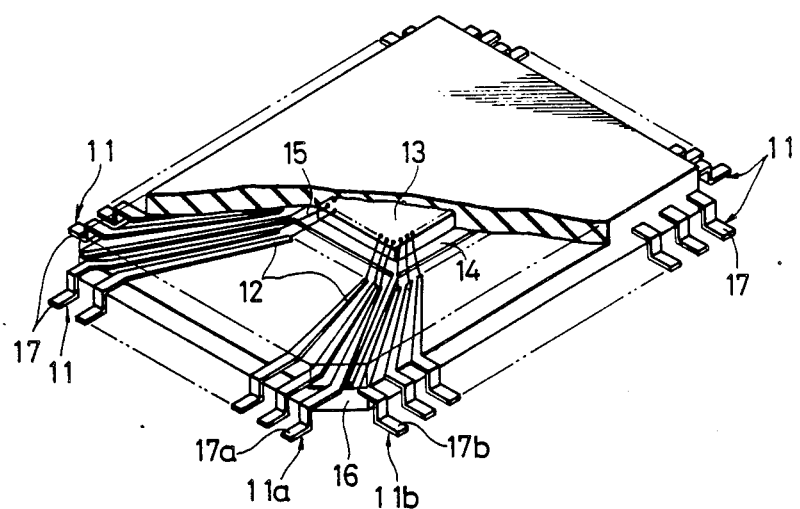
FIG. 3 is a perspective view, partly broken away, of the semiconductor device shown in FIG. 2.

FIG. 2 is a general perspective view of a semiconductor device according to the present invention, while FIG. 3 is a fragmentary sectional view thereof. Numeral 10 designates a package body, and numeral 11 leads (pins) which are protrusively disposed on the four perimetric side faces of the package body 10. The package body 10 is generally flattened by such an expedient, e.g., as molding a resin (plastics) material, for example, epoxy resin, and its shape in plan is a square such as oblong. It encapsulates the inner end parts of the leads 11, namely, inner leads 12 and a semiconductor element pellet 13 therein. The semiconductor pellet 13 is fastened on the upper surface of a tab 14 which is substantially in the shape of a regular square, and the electrode pads thereof and the inner leads 12 of the respective leads 11 are connected by wires 15. In addition, the package body 10 has one corner thereof removed, and the resulting chamfered portion is formed as an index 16. On the other hand, the leads 11 are juxtaposed on each of the four perimetric sides of the package body 10 at equal pitches, and their outer leads 17 are protruded in the four perimetric directions. In this case, the outer leads 17 are bent stepwise so that their fore end parts can contact with the wiring leads of a mounting printed circuit board, not shown, when the package body 10 is placed on the printed circuit board. In addition, the outer leads 17 are disposed so as to become symmetric with respect to the central position of the package body 10 and so as to utilize the perimeter of the package body 10 effectively to the utmost. Accordingly, some of the leads 11 or leads 11a and 11b in the present example are disposed on the chamfered portion, namely, the face of the index 16 of the package body 10. The corresponding outer leads 17a and 17b are protruded from this face in the directions orthogonal to each other.

Now, a method of producing the semiconductor device having the above construction will be described.

Figure 4:
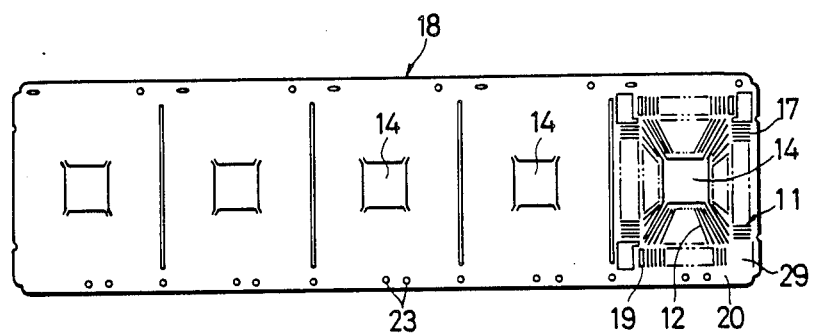
FIG. 4 is a general schematic plan view of a lead frame which is used for producing a semiconductor device according to the present invention.
Figure 5:
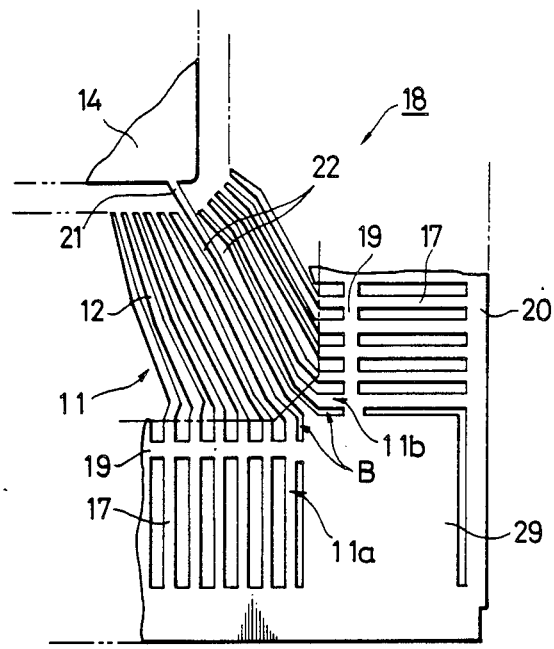
FIG. 5 is an enlarged view of the essential portions of the lead frame shown in FIG. 4.
Figure 7:
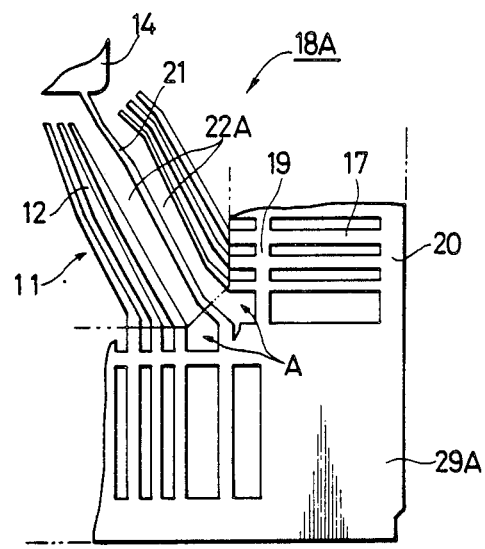
FIG. 7 is a partial enlarged view, corresponding to FIG. 5, of a lead frame in the prior art.

First, as shown in FIG. 4, a metal sheet (which can have a thickness, for example, of about 150 μm) of "42 alloy" (58% by wt. iron and 42% by wt. nickel) or the like is punched to form an elongate lead frame 18. Other materials which can be used to form the lead frame 18 include a phosphor bronze alloy. In the present example, this lead frame 18 is constructed as a multiple frame in which leads etc. corresponding to five packages are continuously provided. Each component for one package has the inner leads 12 of a plurality of leads 11 disposed radiately around a square tab 14 formed in the central part thereof, as also shown in FIG. 5. In addition, the respective leads 11 are integrally coupled by a frame-like dam 19, and their outer leads 17 are extended in the four perimetric directions at equal pitches and coupled to a frame portion 20. Tab suspending leads 21 are respectively provided at the four corners of the tab 14, and they are coupled to the dam 19 thereby to support this tab 14 on the frame portion 20. Shown at numeral 23 (FIG. 4) is each guide hole. Herein, in the present invention, the leads 11a and 11b disposed on the index 16 are arranged in proximity to the tab suspending lead 21 so that the interspaces 22 between the leads 11a, 11b and the tab suspending lead 21 may become as small as possible. By the way, a conventional lead frame 18A shown in FIG. 7 does not include such leads 11a and 11b, so that the interspaces 22A between the tab suspending lead 21 and the adjacent leads 11 are large.

One corner of each package of the lead frame 18 is provided with an unpunched gate top plate portion 29, so as to regulate the flow of a resin in a resin molding operation as will be described later. Symbol 29A indicates a gate top plate portion in the prior art. The plurality of guide holes 23 are formed on both the sides of the lead frame 18 as shown in FIG. 4, and are utilized for feeding in an automatic assembly operation.

Figure 6:
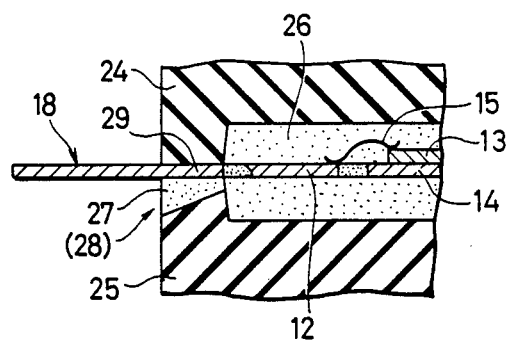
FIG. 6 is a sectional view of a molding state in the case of molding the lead frame shown in FIG. 5.
Figure 8:
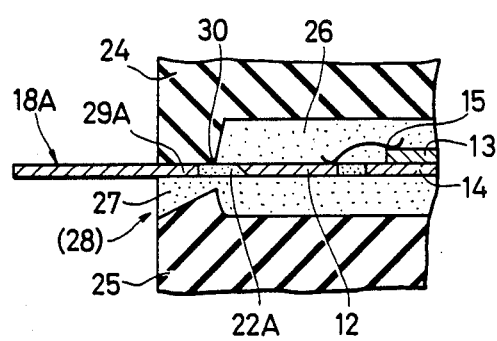
FIG. 8 is a sectional view of a molding state in the prior art.

Secondly, the tab 14 and the inner leads 12 of the lead frame 18 are plated with gold or the like. Thereafter, the semiconductor element pellet 13 is fastened on the surface of the tab 14 by a conventional gold-silicon eutectic method (e.g., rubbing the pellet against the heated tab 14 plated with gold) or the like, and the pellet 13 and the inner leads 12 are joined by the wires 15 to perform electrical connection. The pellet can also be fastened to the tab 14 using an adhesive such as a resin adhesive, e.g., epoxy resin. Thereafter, as illustrated in FIG. 6, the lead frame 18 is set in upper and lower conventional resin molding templets 24 and 25 to arrange the tab 14, inner leads 12, pellet 13 and wires 15 within the cavity 26 of the molding templets, and the molding resin 28 is forcibly introduced into the cavity 26 through a gate 27 which is formed in the lower molding templet 25. For example, the resin can be forcibly introduced into the cavity by conventional resin transfer mold methods. At this time, the gate top plate portion 29 provided at one corner of the lead frame 18 is arranged in a position directly above the gate 27, so that the resin introduced from the gate 27 is guided into a deeper place. The resin forcibly fed into the cavity passes through the interspaces of the lead frame 18 and fills up the whole cavity. With the lead frame according to the present invention, therefore, the leakage (overflow) of the resin to a part B in FIG. 5 can be suppressed owing to the small interspaces between the leads 11a, 11b and the tab suspending lead 21. For example, these small interspaces are about 0.4 mm. In contrast, with the prior art lead frame 18A shown in FIG. 7, resin leakage 30 is liable to occur in the parts A of the figure as illustrated in FIG. 8, on account of the large interspaces 22A. As a comparison, these large interspaces are about 1 mm. When it is intended to eliminate the leakage part after molding and solidification, the drawback is involved that chipping of the package body 10 is incurred.

After the molding encapsulation has been finished in the way described above, the frame portion 20 and dam 19 of the lead frame 18 and also the tab suspending leads 21 thereof are cut away, and the outer leads 17 are bent stepwise by press work. Then, the foregoing semiconductor device can be obtained.

With the semiconductor device of the present example, accordingly, since the package body 10 is provided with the index 16 formed by removing one corner, the recognition of the leads 11 can of course be effected as in the prior art, and since the leads 11a and 11b are disposed also on the index 16, an increase in the number of leads is achieved to that extent and an enhanced density of integration as well as an increased number of pins can be coped with. In addition, the disposition of the leads on the index makes it possible to dispose the leads symmetrically with respect to the center of the package body. This can facilitate the design, fabrication and mounting of the semiconductor device on the mounting circuit board, etc.

Moreover, according to the production method of the present invention, the pellet fastening operation, wire connecting operation and resin molding operation are carried out by the use of the lead frame in which the leads are disposed in the index part of the package body to be formed. Therefore, the leakage of the resin molding is suppressed, and the overflow of the resin and the attendant chipping, etc. are prevented, so that a semiconductor device of high marketability can be produced.

Here, it goes without saying that the constructions of the illustrated semiconductor device and lead frame are mere examples and that various modifications thereof can be used.

As set forth above, according to the semiconductor device of the present invention, leads are also disposed in the index portion of a package body. This is effective for enhancing the density of integration or increasing the number of pins of a semiconductor device, and simultaneously permits the symmetric arrayal of leads to facilitate design, fabrication and mounting. Besides, according to the production method of the present invention, a lead frame of small interspaces is used. This can suppress the overflow of a resin and prevent chipping, etc., so that enhancement in the external appearance and enhancement in the marketability of the semiconductor device can be achieved.

In addition, according to the lead frame of the present invention, leads are disposed in the index portion of a package body. This prevents resin leakage and chipping during the resin molding of the package, to prevent the marketability from degrading. Another effect is to cope with enhancement in the density of integration and increase in the number of pins of a semiconductor device to which this lead frame is applied, and to facilitate design, fabrication and mounting.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A semiconductor device comprising a package body, made of a resin, encapsulating a semiconductor element, said package body having four sides and having a regular square or oblong shape, a plurality of connection leads which jut out from each of the four sides of said package body, a tab surrounded by said connection leads and having said semiconductor element positioned thereon, tab suspending leads extending from said tab, and a chamfered portion which is formed in at least one corner of said package body, said plurality of connection leads being connected to electrode pads on the semiconductor element, at least one of said plurality of connection leads jutting out from said chamfered portion.

2. A semiconductor device according to claim 1, wherein said plurality of connection leads jutting out from each of the four sides of said package body and from said chambered portion are arranged so as to be symmetric with respect to a center of said package body.

3. A semiconductor device according to claim 5, further comprising wire means for connecting said plurality of connection leads to corresponding electrode pads of said semiconductor element.

4. A semiconductor device according to claim 3, wherein said plurality of connection leads jutting out from each of the four sides of said package body and from said chamfered portion are bent stepwise.

5. A semiconductor device according to claim 1, wherein said plurality of leads and said tab are made of metal.

6. A semiconductor device according to claim 3, wherein the tab suspending leads, extending from said tab, do not jut out from said package body.

7. A semiconductor device according to claim 1, wherein said at least one of said plurality of connection leads jutting out from said chamfered portion juts out from said package body in substantially the same direction as connection leads jutting out from a side of said package body adjacent the chamfered portion.

8. A semiconductor device according to claim 2, wherein said at least one of said plurality of connection leads jutting out from said chamfered portion juts out from said package body in substantially the same direction as connection leads jutting out from a side of said package body adjacent the chamfered portion.

9. A semiconductor device according to claim 3, wherein said at least one of said plurality of connection leads jutting out from said chamfered portion juts out from said package body in substantially the same direction as connection leads jutting out from a side of said package body adjacent the chamfered portion.

10. A semiconductor device according to claim 4, wherein said at least one of said plurality of connection leads jutting out from said chamfered portion juts out from said package body in substantially the same direction as connection leads jutting out from a side of said package body adjacent the chamfered portion.

11. A semiconductor device according to claim 5, wherein said at least one of said plurality of connection leads jutting out from said chamfered portion juts out from said package body in substantially the same direction as connection leads jutting out from a side of said package body adjacent the chamfered portion.

12. A semiconductor device according to claim 6, wherein said at least one of said plurality of connection leads jutting out from said chamfered portion juts out from said package body in substantially the same direction as connection leads jutting out from a side of said package body adjacent the chamfered portion.

* * * * *